United States Patent [19]
Devore

[11] Patent Number: 4,987,311
[45] Date of Patent: Jan. 22, 1991

[54] ELECTRON-DETECTOR DIODE BIASSING SCHEME FOR IMPROVED WRITING BY AN ELECTRON BEAM LITHOGRAPHY MACHINE

[75] Inventor: William J. Devore, Hayward, Calif.

[73] Assignee: Etec Systems, Inc., Hayward, Calif.

[21] Appl. No.: 391,202

[22] Filed: Aug. 8, 1989

[51] Int. Cl.⁵ .............................................. H01J 37/30
[52] U.S. Cl. .................................. 250/492.2; 250/397
[58] Field of Search .................. 250/397, 492.2, 492.1

[56] References Cited

U.S. PATENT DOCUMENTS 4,680,468  7/1987  Bouchard et al. .................. 250/397

*Primary Examiner*—Bruce C. Anderson
*Attorney, Agent, or Firm*—Joseph R. Dwyer

[57] ABSTRACT

Disclosed is a biassing scheme for a beam position location apparatus (50) which comprises electron detector diodes (52) in an electron beam lithography machine (10) such that the detector diodes (52) deposit fewer secondary electrons (62) on a substrate (16) being processed by the electron beam (22) and thus reduce or eliminate any charge buildup on said substrate which deflect the electron beam (22) causing pattern distortion.

5 Claims, 3 Drawing Sheets

ELECTRON-DETECTOR DIODE BIASSING SCHEME FOR IMPROVED WRITING BY AN ELECTRON BEAM LITHOGRAPHY MACHINE

BACKGROUND OF THE INVENTION

This invention relates, in general, to electron beam lithography and is particularly directed to the reduction in pattern distortion during beam writing on a workpiece in an electron beam lithography machine.

In an electron beam lithography machine, there is a beam column in which an electron beam is electronically and magnetically controlled and projected onto a workpiece which is mounted on a movable stage to perform a writing operation on the workpiece. The workpiece also called a substrate and may be a resist coated wafer or a resist coated mask located below the beam column.

When the electron beam bombards the substrate, the beam produces high energy backscattered electrons which are reflected upwardly and outwardly from the impact point and which are sensed by electron detector diodes located near the exit of the beam column to detect the position of the beam at the point of impact. However, when these backscattered electrons bombard the electron detector diodes, these detector diodes themselves emit more backscattered electrons and also secondary electrons of lesser energy, both of which are directed down onto the substrate because of the close proximity of the substrate to the detector diodes. The backscattered electrons are able to penetrate the resist but the secondary electrons, because of their lesser energy, are deposited on the resist, which is non-conducting, and cause a charge buildup on the resist which in turn can deflect the electron beam. This means that the electron beam may not be bombarding the substrate where it is supposed to and this leads to pattern distortion.

It is therefore an object of this invention to reduce or eliminate pattern distortion caused by secondary electrons emitted by the electron detector diodes used in an electron beam lithography machine.

SUMMARY OF THE INVENTION

The invention which attains the foregoing object comprises a biasing scheme for electron detector diodes in an electron beam lithography system such that the detector diodes deposit fewer secondary electrons on a substrate during writing by the electron beam and thus reduce or eliminate the charge buildup caused by the secondary electrons on the substrate which deflects the beam position resulting in pattern distortion.

DETAILED DESCRIPTION

Figure 1:
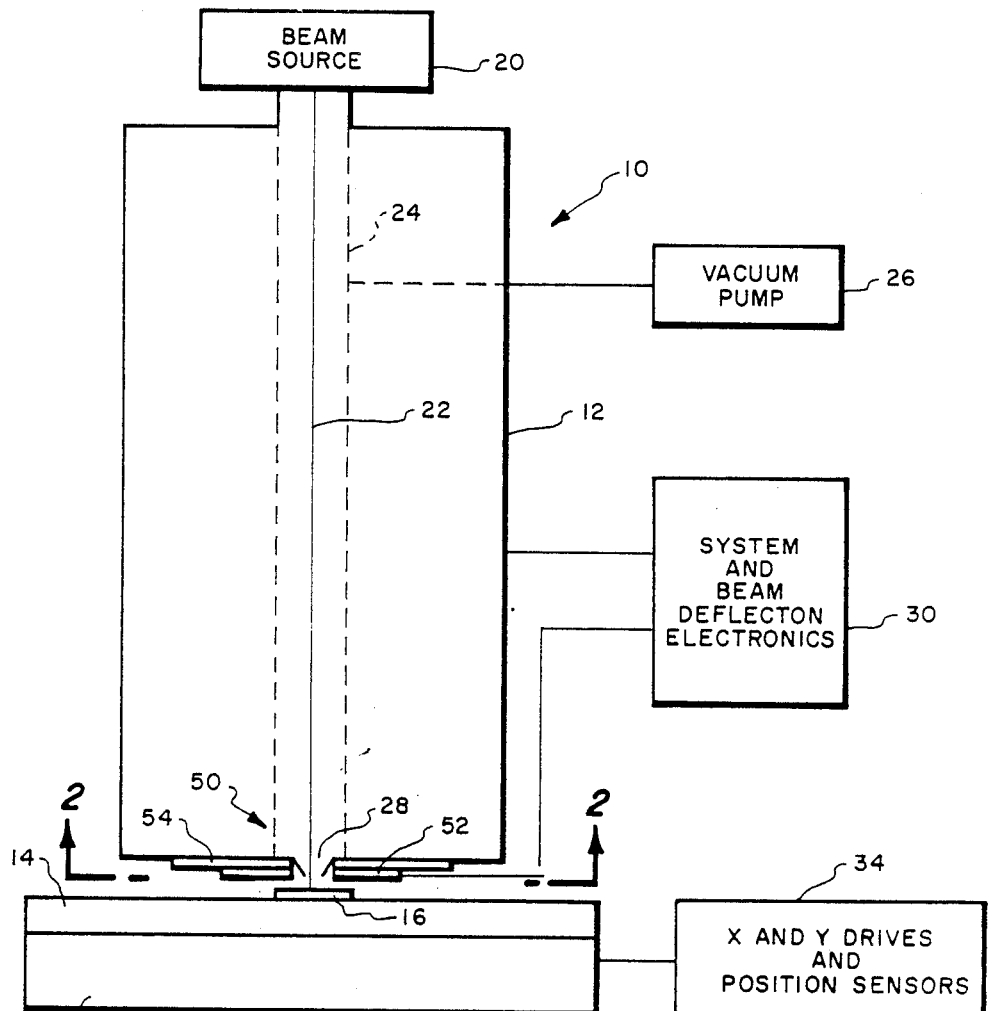
FIG. 1 is a schematic illustration of an electron beam lithography machine incorporating electron detectors.

In the schematic illustration, FIG. 1, the electron beam lithography machine incorporating this invention is identified in its entirety as 10. The machine includes an electron beam column 12 and a workholding apparatus 14 upon which a workpiece 16 is loaded, processed and unloaded. The workpiece 16 is a semiconductor wafer or mask and is referred to as a substrate or simply a wafer.

As part of the beam column 12, there is provided an electron beam source 20, demagnification, projection and deflection optics which generate a finely focused beam 22 and may also include illumination and shaping optics when a shaped beam is used. A central tube 24, (shown in phantom) within the column 12 is traversed by the beam 22 and maintained at a high vacuum by a high vacuum pump 26 coupled to the column 12. The beam 22 passes through an aperture 28 in the column and impinges on the substrate 16 for processing the latter. The complete lithography machine further includes a computer (controller) and associated binary electronics which controls the beam 22, controls a drive system for driving the workholding apparatus 14, stores pattern data and provides beam control signals; all identified by a block diagram 30.

Figure 2:
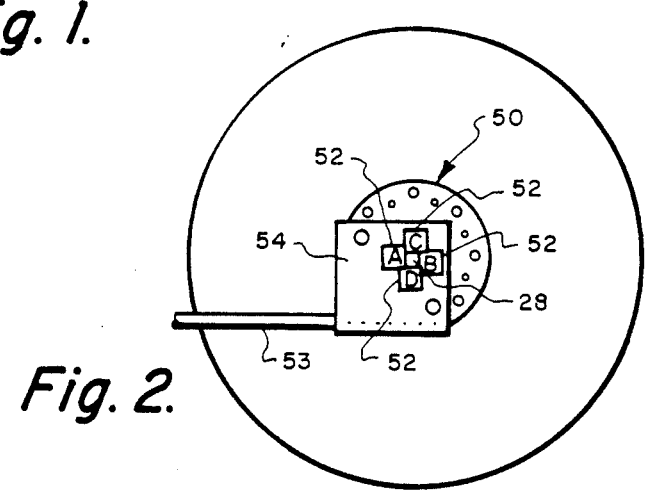
FIG. 2 is a bottom view of the electron beam column showing the electron detector arrangement near the exit of the electron beam.

In the simplified schematic illustration of FIG. 1, the workholding apparatus 14 includes a stage 32 which is driven in the x-y direction and in the z direction by conventional drives and its position sensed by a sensing system; all identified by block diagram 34. As further shown in FIG. 1, the electron beam lithography machine 10 also includes a electron beam detection apparatus 50 in the form of a plurality of electron detector diodes 52 mounted on a plate 54 and positioned in close proximity to the aperture 28. FIG. 2 shows four such diodes A,B,C and D, connected to conductor 53, surrounding the aperture 28.

Figure 3:
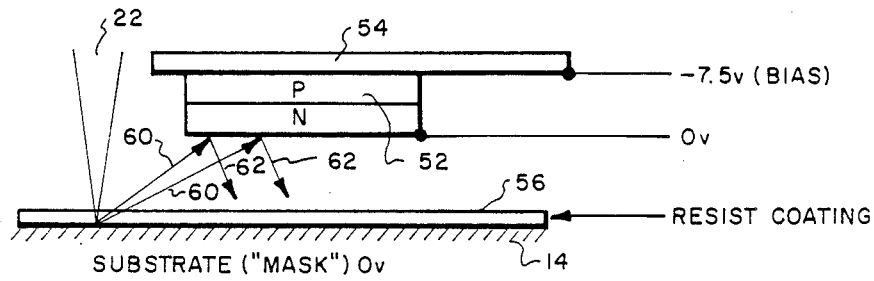
FIG. 3 is a schematic illustration of one prior art electron detector and illustrating the secondary electrons being deposited on the substrate surface which cause pattern distortion.

In the schematic enlargement of one detector diode 52, FIG. 3, and biased according to the prior art, the electron beam 22 is shown penetrating a non-conductive resist coating 56 on the substrate 16. In this arrangement, the substrate 14 is biased at 0.0 volt, the detector diode 52 at 0.0 volt and the plate 54 at some negative potential, such as −7.5 volts. With this bias, the bombardment of the substrate by the electron beam 22 causes backscattered electrons, represented by arrows 60, to travel toward the electron detector 52 which, in turn, emits both backscattered electrons (not shown) and secondary electrons, represented by arrows 62, directed toward the resist coating 56. These secondary electrons 62 have lower energy and are thus unable to penetrate the resist coating 56. This causes a charge buildup on the resist surface which, in turn, can deflect the beam 22 so that the beam may not bombard the substrate 16 where it is supposed to and thus cause pattern distortion.

Figure 4:
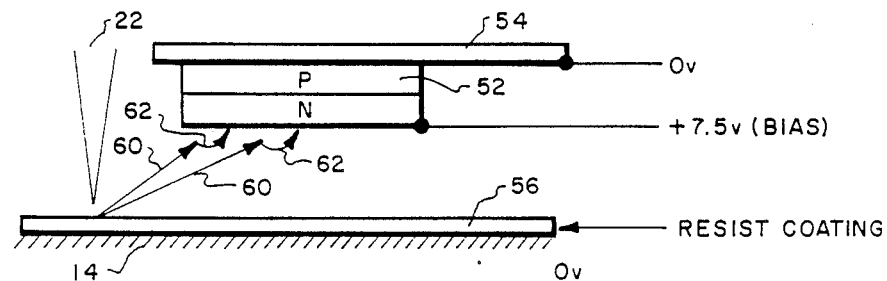
FIG. 4 is a schematic illustration of one electron detector of this invention and illustrating an absence of the secondary electrons being deposited on the substrate which would have otherwise caused pattern distortion.

FIG. 4, which is similar to FIG. 3, but shows the bias on the detector diode 52 relative to the substrate 16 according to the bias scheme of this invention. This bias is 0.0 volts on the substrate 16, +7.5 volts on the diode 52 and 0.0 volts on the plate 54. This figure also shows that because of the bias scheme, the secondary electrons 62 with energy less than 7.5 eV do not travel to resist 66 and thus do not cause a charge buildup to affect the placement of the electron beam 22.

Figure 5:
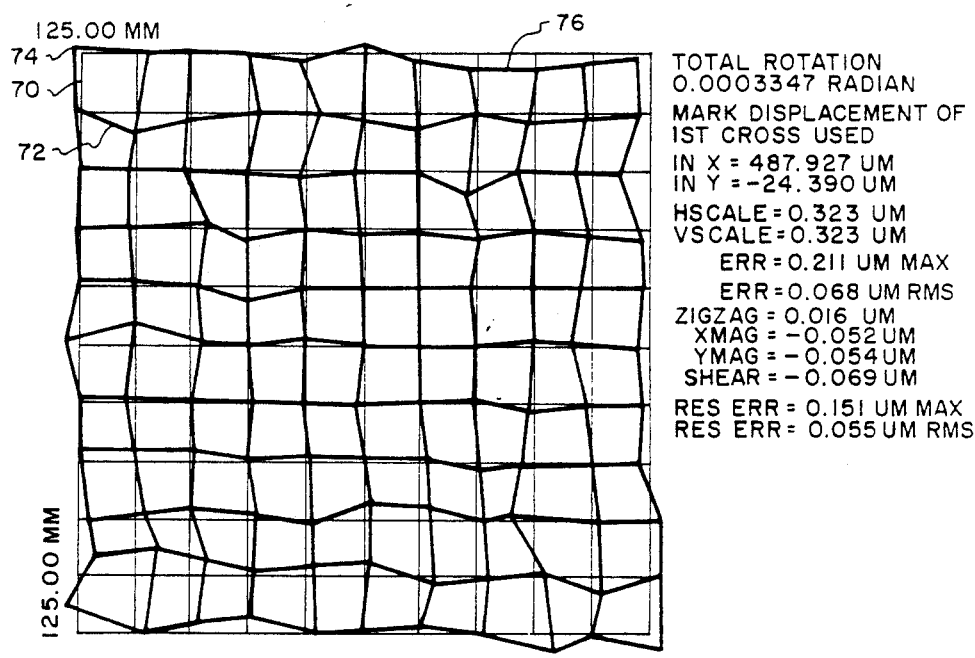
FIGS. 5 and 6 illustrate a comparison of the test patterns showing the pattern distortion caused by the prior art electron detector and the writing improvement as a result of this invention.
Figure 6:
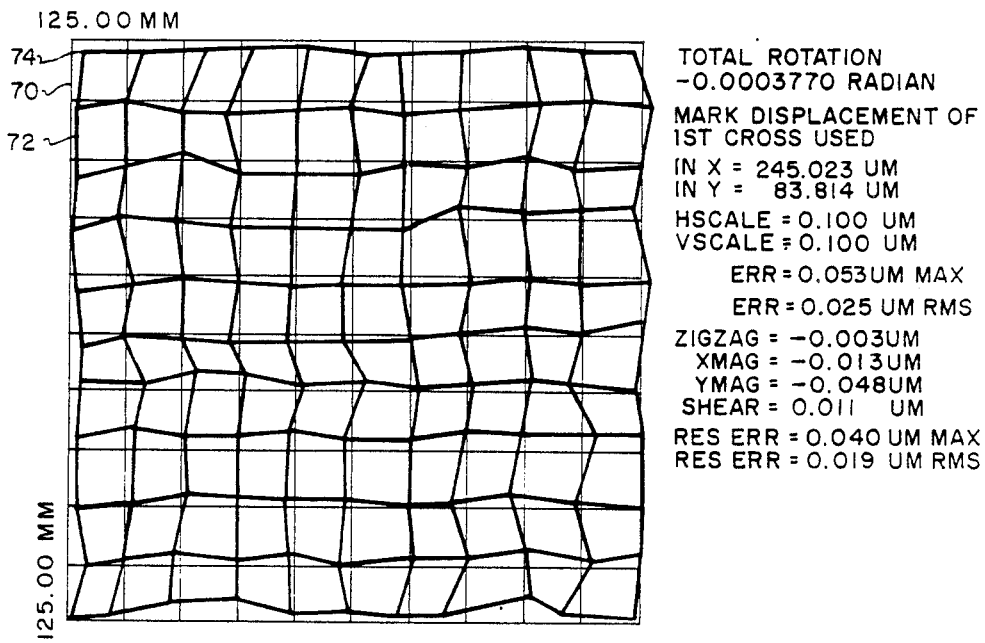

FIG. 5 shows the effect of pattern distortion caused by the charge buildup on the substrate and FIG. 6 shows the correction of the pattern utilizing the present invention.

More specifically, FIG. 5 shows an underlying grid 70 comprising a plurality of squares with an overlying pattern 72 of distorted squares. Each of the distorted squares has a point 74 in its upper left hand corner. These points 74 represent the location of crosses (not shown) which were written by a machine under test. These marks formed an 11×11 array on a mask 125 mm square with the spacing between the crosses being 12.5 mm. This mask was processed and then placed in a second machine which located the crosses at points, such as 74, and determined the coordinants of each of the crosses. In plotting the errors, the distance between the undistorted square corners is the amount shown in HSCALE (horizontal) or VSCALE (vertical). In FIG. 5, the crescent-shaped distortion 76 in the upper right hand corner shows errors of about 0.1 micrometer (um). This crescent 76 is caused by the secondary electrons from the diode detector 52 in the following way. During the period of beam adjustment, lasting about five minutes, preceeding pattern writing, the beam 22 is positioned at a test target approximately 15 mm off the writing surface just above the crescent 76. It is during this five minute period that secondary electrons accumulate on the writing surface just above (as shown in the drawings) where the top row of crosses will be written. The charge remains long enough to deflect the first row of crosses and produce the characteristic crescent distortion 76.

FIG. 6 is written with this invention in place. Note that the HSCALE/VSCALE numbers have changed to 0.100 um because of smaller errors being found. There is no trace of the crescent distortion 76.

I claim:

1. In an electron beam lithography machine with a beam column and having a controlled electron beam capable of writing a pattern on a substrate located beneath the beam column, the improvement in a beam position locating apparatus comprising, electron detector means which locates the beam position by responding to backscattered electrons generated by the electron bombardment on said substrate by said electron beam, and means to reduce or eliminate secondary electrons emitted from said detector in response to said bombardment from reaching said substrate thereby reducing or eliminating a charge buildup on said substrate which would deflect said beam and cause pattern distortion.

2. The machine as claimed in claim 1 wherein the means to reduce or eliminate said secondary electrons from reaching said substrate comprises a biasing means on said electron detector means to attract said secondary electrons.

3. The machine as claimed in claim 2 wherein said biasing means comprises the application of a voltage on said detector means which is positive with respect to said substrate.

4. The machine as claimed in claim 1 wherein said electron detector means comprises diode means and wherein the means to reduce or eliminate said secondary electrons from reaching said substrate comprises a biasing means on said diode means to attract said secondary electrons.

5. The machine as claimed in claim 4 wherein said biasing means comprises the application of a voltage on said diode means which is positive with respect to said substrate.

* * * * *